United States Patent
Subramanian et al.

(10) Patent No.: US 6,458,691 B1
(45) Date of Patent: Oct. 1, 2002

(54) DUAL INLAID PROCESS USING AN IMAGING LAYER TO PROTECT VIA FROM POISONING

(75) Inventors: Ramkumar Subramanian, Sunnyvale; Christopher F. Lyons, Fremont; Marina V. Plat, San Jose; Bhanwar Singh, Morgan Hill, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/824,662

(22) Filed: Apr. 4, 2001

(51) Int. Cl.$^7$ .......................................... H01L 21/4763
(52) U.S. Cl. .................. 438/638; 438/586; 438/623; 438/624; 438/634
(58) Field of Search .................. 438/586, 597, 438/623, 624, 637–640, 634

(56) References Cited

U.S. PATENT DOCUMENTS

| | | | |
|---|---|---|---|
| 4,316,946 A | 2/1982 | Masters et al. ................. 430/9 |
| 5,204,226 A | 4/1993 | Baier et al. .................. 430/326 |
| 5,393,702 A | 2/1995 | Yang et al. .................. 437/195 |
| 5,432,073 A | 7/1995 | Wu et al. ..................... 438/624 |
| 5,643,407 A | 7/1997 | Chang ......................... 438/623 |
| 5,814,186 A | 9/1998 | Nguyen ....................... 438/703 |
| 5,866,306 A | 2/1999 | Miller et al. ................. 430/326 |
| 5,989,776 A | 11/1999 | Felter et al. ............. 430/270.1 |
| 6,013,579 A | 1/2000 | Wang et al. ................. 438/692 |
| 6,043,147 A | 3/2000 | Chen et al. .................. 438/624 |
| 6,046,104 A | 4/2000 | Kepler ........................ 438/637 |
| 6,054,769 A | 4/2000 | Jeng ............................ 257/758 |
| 6,080,526 A | 6/2000 | Yang et al. .................. 430/296 |
| 6,083,851 A | 7/2000 | Shields et al. .............. 438/776 |
| 6,093,966 A * | 7/2000 | Venkatraman et al. ...... 257/751 |
| 6,103,456 A | 8/2000 | Többen et al. .............. 430/317 |
| 6,124,640 A | 9/2000 | Sahota et al. ............... 257/758 |
| 6,140,226 A * | 10/2000 | Grill et al. ................... 438/637 |
| 6,150,256 A | 11/2000 | Furukawa et al. .......... 438/618 |
| 6,204,168 B1 * | 3/2001 | Naik et al. .................. 438/638 |
| 6,261,937 B1 * | 7/2001 | Tobben et al. .............. 438/601 |

OTHER PUBLICATIONS

"Silicon Processign for the VLSI Era," Lithography I: Optical Resist Materials and Process Technology, pp. 423–428, (1986).

* cited by examiner

*Primary Examiner*—Ha Tran Nguyen
(74) *Attorney, Agent, or Firm*—Foley & Lardner

(57) ABSTRACT

There is provided a method of making a dual inlaid via in a first layer. The first layer may be a polymer intermetal dielectric, such as HSQ, of a semiconductor device. The method includes forming a first opening, such as a via, in the first layer and forming an inorganic base radiation sensitive layer in the first opening. The radiation sensitive layer may be a polysilane imaging layer. The inorganic base radiation sensitive layer is selectively exposed to radiation and then patterned. A second opening, such a trench, is formed in communication with the first opening using the patterned inorganic base radiation sensitive layer as a mask. A conductive layer may be formed in the dual inlaid via to complete a dual damascene process.

29 Claims, 6 Drawing Sheets

DUAL INLAID PROCESS USING AN IMAGING LAYER TO PROTECT VIA FROM POISONING

This application is related to commonly assigned application titled "Dual Inlaid Process Using a Bilayer Resist," Ser. No. 09/824,696, filed on the same date as the present application.

BACKGROUND OF THE INVENTION

This invention is related generally a method of making a semiconductor device and specifically to a dual damascene process using a silicon containing imaging layer.

In order to increase the miniaturization of semiconductor devices, contacts between conductive layers in a semiconductor device are formed by the dual damascene process which utilizes a dual inlaid via. An example of the "via first" dual damascene process is illustrated in FIGS. 1A–F.

Figure 1A:
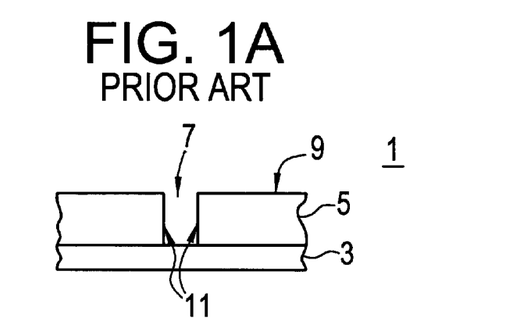
FIGS. 1A–F illustrate a side cross sectional view of a prior art dual damascene process.

FIG. 1A illustrates a portion of an in process metallization section 1 of a semiconductor device. The metallization section contains a first conductive layer 3 and an insulating layer 5 formed over the first conductive layer 3. The conductive layer 3 may be a metal interconnect, such as an aluminum interconnect. The insulating layer 5 contains a narrow via 7 which extends from the top surface 9 of the insulating layer 7 to the first conductive layer 3. The via 7 has a circular cross section and contains only one sidewall 11 having a circular perimeter.

Figure 1B:
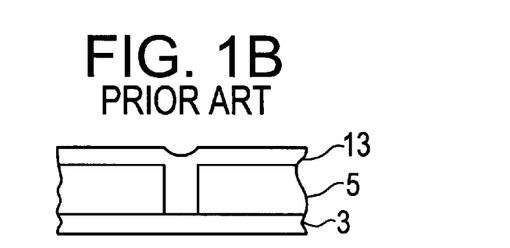
Figure 1C:
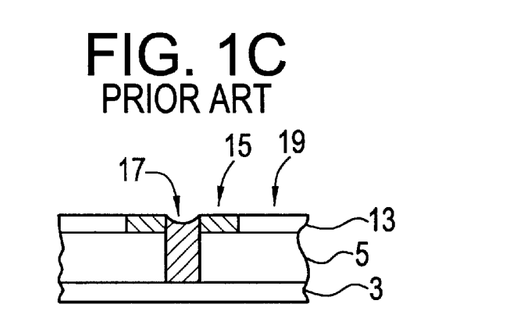
Figure 1D:
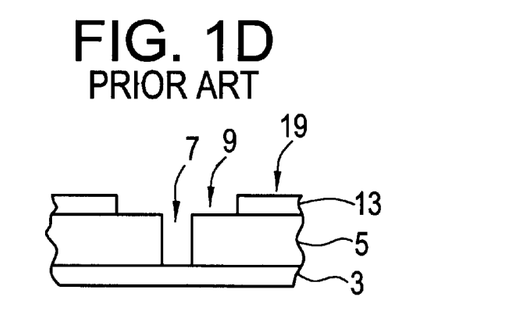
Figure 1E:
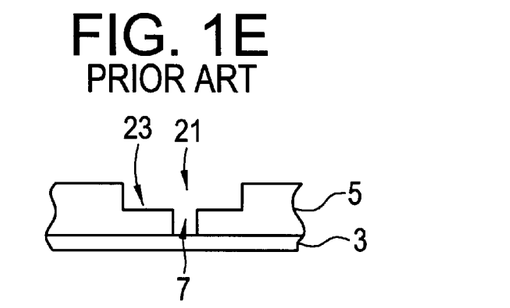

A conventional, organic polymer photoresist layer 13 having a carbon backbone, such as a positive novolac photoresist layer, is formed in the via 7 and over the upper surface 9 of the insulating layer 5, as shown in FIG. 1B. The photoresist layer 13 is selectively exposed to radiation through a conventional lithographic mask or reticle (not shown), as illustrated in FIG. 1C. During the exposure, a first portion 15 of the photoresist layer 13 over the upper surface 9 of the insulating layer 5 directly adjacent to via 7 sidewall 11 and a second portion 17 of the photoresist layer 13 in the via 7 are exposed, as indicated by the cross hatching in FIG. 1C. A third portion 19 of the photoresist layer over the upper surface 9 of the insulating layer 5 distal from the via sidewall 11 is shielded by the mask and is not exposed to radiation. The exposed positive photoresist is then patterned to remove the exposed first and second photoresist portions 15, 17 while leaving the third portion 19 of the photoresist layer 13 on the insulating layer 5 as a mask, as illustrated in FIG. 1D.

The exposed upper surface 9 of the insulating layer 5 is etched using the third portion 19 of the photoresist layer 13 as a mask to form a trench 21 having a width greater than that of the via 7. The third portion 19 of the photoresist layer 13 is removed by conventional techniques, such as ashing, to form a structure illustrated in FIG. 1E. The top of the via 7 is located in a bottom surface 23 of the trench 21. In other words, the exposed portion of the insulating layer 5 is etched to remove a top section of the exposed portion of the insulating layer, without etching the bottom section of the exposed portion.

Figure 1F:
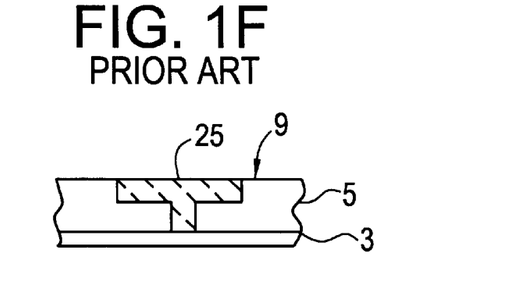

The dual damascene process is then completed by forming a second conductive layer 25, as illustrated in FIG. 1F. The second conductive layer 25 may be a metal layer which is formed in the trench 21, such that it extends through the via 7 to contact the first conductive layer 3. The second conductive layer is planarized by chemical mechanical polishing or etch back such that its top surface is even with the upper surface 9 of the insulating layer 5.

Figure 2:
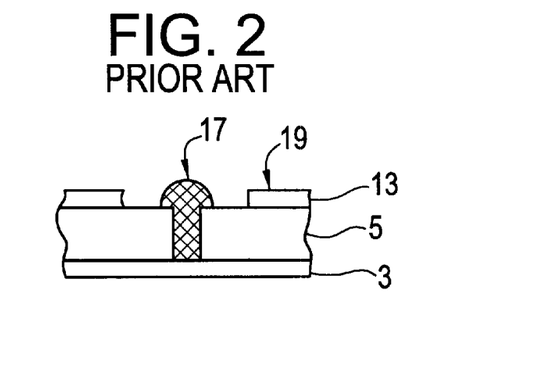
FIG. 2 illustrates the formation of a rigid mushroom shape in the prior art process.

However, the prior art dual damascene process suffers from a problem of via poisoning. This problem is illustrated in FIG. 2. During the photoresist exposure step illustrated in FIG. 1C, the second portion 17 of the photoresist layer 13 binds to the via 7 sidewall 11 and forms a rigid mushroom shape, especially when the via 7 width is small, as shown in FIG. 2. Therefore, the second portion 17 of the photoresist layer 13 cannot be removed from the via 7 during subsequent developing and ashing steps because it is chemically and/or physically bound to the via sidewall 11. Thus, the second conductive layer 25 cannot contact the first conductive layer 3 through the via 7 because the via 7 is filled by the second portion 17 of the photoresist layer which is rigidly bound to the via 7 sidewall 11. This causes an open circuit between the first and second conductive layers which leads to device failure. This poison via problem is especially severe when the insulating layer 5 is a low-k (i.e., a low dielectric constant) polymer material, such as hydrogensilsesquioxane (HSQ).

BRIEF SUMMARY OF THE INVENTION

According to one aspect of the present invention, there is provided a method of making a dual inlaid via in a first layer, comprising forming a first opening in the first layer, forming an inorganic base radiation sensitive layer in the first opening, selectively exposing the inorganic base radiation sensitive layer to radiation, patterning the exposed inorganic base radiation sensitive layer, and forming a second opening in communication with the first opening using the patterned inorganic base radiation sensitive layer as a mask.

According to another aspect of the present invention, there is provided a method of making a semiconductor device containing a dual inlaid via, comprising forming a via in a polymer containing insulating layer, forming a first silicon backbone containing polymer imaging layer in the via in contact with the via sidewall and a bottom surface of the via and over an upper surface of the insulating layer and selectively exposing the imaging layer to radiation. The method further comprises patterning the exposed first imaging layer to remove a first portion of the first imaging layer from the upper surface of the insulating layer directly adjacent to via sidewall and a second portion of the first imaging layer in contact with the via sidewall and the bottom surface of the via, while leaving a third portion of the first imaging layer over the upper surface of the insulating layer distal from the via sidewall, and etching an exposed upper portion of the insulating layer using the third portion of the imaging layer as a mask to form a trench having a width greater than that of the via, such that a top of the via is located in a bottom surface of the trench.

According to another aspect of the present invention, there is provided a method of making a semiconductor device containing a dual damascene contact, comprising forming an active element over a substrate, forming a first conductive layer over the active element, forming an insulating layer over the first conductive layer and forming a first polysilane imaging layer over the insulating layer. The method further comprises selectively exposing the first imaging layer to radiation, patterning the first imaging layer, and etching the insulating layer using the patterned first imaging layer as a mask to form a via having a first radius extending through the insulating layer to the first conductive layer. The method further comprises removing the first imaging layer, forming a second polysilane imaging layer having a thickness smaller than the first radius in the via in contact with via sidewall and a bottom surface of the via and over an upper surface of the insulating layer, such that the second polysilane imaging layer does not fill an entire volume of the via and selectively exposing a first and a second portions of the second imaging layer to radiation through a mask. The method further comprises patterning the exposed second imaging layer to remove the first portion of the second imaging layer from the upper surface of the insulating layer directly adjacent to the via sidewall and a second portion of the second imaging layer in contact with the sidewall and the bottom surface of the via, while leaving a third portion of the second imaging layer over the upper surface of the insulating layer distal from the via sidewall, etching an exposed upper portion of the insulating layer using the third portion of the second imaging layer as a mask to form a trench having a width greater than that of the via, such that a top of the via is located in a bottom surface of the trench, forming a second conductive layer in the trench such that the second conductive layer contacts the first conductive layer through the via, and planarizing the second conductive layer such that a top surface of the second conductive layer is substantially level with the upper surface of the insulating layer.

DETAILED DESCRIPTION OF THE PREFERRED EMBODIMENTS

The present inventors have realized that the poison via problem of the prior art dual damascene process occurs because the organic (i.e., carbon based or carbon backbone containing) photoresist layer forms a chemical bond with the etched sidewall(s) of an opening in an insulating layer. The chemical bonding is especially strong when the insulating layer is a low-k polymeric material, such as HSQ. Therefore, the chemical bonding between the photoresist and the opening sidewall(s) prevents removal of the photoresist from the opening. This problem is exacerbated in the "via first" dual inlaid via process, since the photoresist is located in a very narrow via, such as a via having an aspect ratio greater than 2, which has a low volume but a high sidewall surface area. Thus, almost the entire volume of the photoresist in the via contacts and is bound to the via sidewall(s). Thus, it is especially difficult to remove the carbon based photoresist, such as novolac, from a narrow via.

While not wishing to be bound to any particular theory of operation, the present inventors believe that the bonding between the photoresist and the opening (i.e., via) sidewall occurs by the following mechanism. When the via is etched using a plasma etching method, the via sidewall is damaged by the etching step. The damage may include dangling bonds on the via sidewall and etching gas impurities, such as nitrogen and/or carbon, bound to the via sidewall. This via sidewall damage is particularly severe in low-k dielectrics, such as HSQ. In contrast, the unetched top surface of the insulating layer is not damaged because it is masked by the photoresist during etching. The present inventors believe that the dangling bonds and/or impurities bound to the via sidewall chemically bind to the carbon based photoresist. The present inventors also believe that the exposing radiation which is used to expose the positive photoresist located in the via may provide the energy which causes the carbon based photoresist to bind to the damaged via sidewall. While the inventors believe that the bonding occurs by this mechanism, the present invention should not be considered to be limited by this bonding mechanism.

The present inventors have realized that if the conventional, organic base photoresist (i.e., a photoresist whose major constituent is a carbon backbone polymer), such as novolac, is replaced by an inorganic base radiation sensitive layer (i.e., a radiation sensitive layer whose major constituent lacks a carbon backbone polymer), then such an inorganic base radiation sensitive layer would not bind to the damaged opening (i.e., via or trench) sidewall or would bind to the sidewall to a lesser degree. Thus, such a radiation sensitive layer would be easier to remove from the via and the via blockage illustrated in FIG. 2 could be reduced or avoided. This would decrease the amount of open circuits between the conductive layers of a semiconductor device.

Thus, any inorganic base radiation sensitive layer may be used to fill the opening during a dual inlaid via process, according to the preferred embodiments of the present invention. In one aspect of the present invention, the inorganic base radiation sensitive layer comprises a silicon containing imaging layer, such as that used as a top sublayer of a bi-layer photoresist. In a preferred aspect of the present invention, the silicon containing imaging layer comprises a polysilane or a polysiloxane imaging layer. Most preferably, the imaging layer comprises a polysilane polymer imaging layer. For example, the polysilane polymer layer may comprise polybisalkyl silane, polymethylphenyl silane or polyalkylphenyl silane. These polymers are considered to have an "inorganic base" despite containing organic groups because these polymers have a silicon backbone rather than a carbon backbone.

The imaging layer preferably has a thickness of 200 to 2,000 angstroms, preferably 400 to 800 angstroms for vias whose width is 1,800 to 4,500 angstroms, preferably 1,800 to 2,500 angstroms (this corresponds to a (i.e., a 900 to 2250 angstrom radius, preferably a 900 to 1250 angstrom radius of a round via). Thus, the thickness of the imaging layer is preferably less than that of a radius of a round via, most preferably less than one half of the radius of the round via. Therefore, the preferred imaging layer has a thickness such that the imaging layer does not fill the entire volume of the via, but that the imaging layer contacts the sidewall(s) and the bottom surface of the via. Most preferably, the imaging layer contacts the entire sidewall(s) and bottom surface of the via. Thus, since the preferred imaging layer does not fill the entire volume of the via, it is less likely to form the rigid mushroom shape of FIG. 2 and is easier to remove from the via.

However, the radiation sensitive layer may comprise inorganic base layers other than silicon backbone polymers. For example, the radiation sensitive layer may comprises a chalcogenide glass photoresist, as disclosed on pages 426–427 of S. Wolf & R. N. Tauber *Silicon Processing for the VLSI Era,* Vol. 1 (1986). The chalcogenide glass photoresist comprises a $Ge_xSe_{1-x}$ glass layer which is covered by a silver containing layer, such as a $AgNO_3$ fluid layer. The silver containing layer is selectively exposed to radiation, which causes the silver to diffuse into the glass layer in the exposed areas. The unexposed glass regions where silver was not diffused are selectively removed with an alkaline solution, which does not etch the silver photodoped glass.

In a preferred aspect of the present invention the insulating layer which contains the opening, such as the via and/or trench, comprises a low-k dielectric layer having a dielectric constant of 3.7 or less, preferably 3.5 or less, most preferably 3.0 or less. In one preferred aspect of the present invention, the low-k insulating layer comprises a polymer containing a backbone which contains silicon. For example, the insulating layer may comprise at least one polymer selected from hydrogensiloxanes which have the formula $[(HSiO_{1.5})_xO_y]_n$, hydrogensilsesquioxanes which have the formula $(HSiO_{1.5})_n$, and hydroorganosiloxanes which have the formulas $[(HSiO_{1.5})_x \ O_y \ (RSiO_{1.5})_z]_n$ or $[(HSiO_{1.5})_x (RSiO_{1.5})_y]_n$, where x=6 to 20, y=1 to 3, z=6 to 20, n=1 to 4,000, and each R is independently H, $C_1$ to $C_8$ alkyl or $C_6$ to $C_{12}$ aryl. The most preferred material for the insulating layer is hydrogensilsesquioxane (HSQ).

However, the insulating layer may comprise other polymer type materials, such as organic spin-on glass, polysilsequioxane, siloxane parylene, PTFE, polyimide, fluorinated polyimide, benzocyclobutene, fluorinated benzocyclobutene, polyarylene ether or fluorinated polyarylene ether. For example, one such material is a nonfluorinated poly(arylether) available under the tradename FLARE™ from AlliedSignal Inc. Furthermore, the dual inlaid via may be formed in a conductive layer (i.e., metal, metal compound or doped polysilicon) or a semiconductor layer (i.e., silicon, SiC, III-V or II-VI) layers, rather than in an insulating layer, if it is desired to form a dual inlaid via in such a layer.

Figures 3A, 3D:
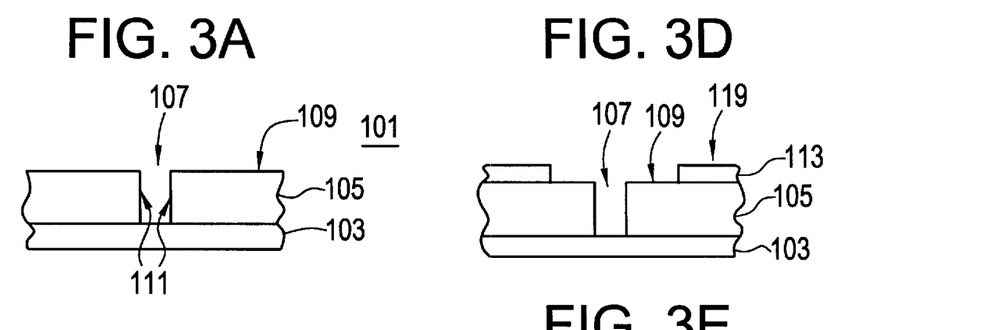
FIGS. 3A–F illustrate a side cross sectional view of a "via first" dual damascene process according to the first preferred embodiment of the present invention.

FIGS. 3A–F illustrate a first preferred embodiment of the present invention in which a dual inlaid via for a dual damascene process is formed by the "via first" patterning technique using the inorganic base radiation sensitive layer. FIG. 3A illustrates a portion of an in process metallization section 101 of a semiconductor device. The metallization section contains a first conductive layer 103. The conductive layer 103 may be a metal interconnect or electrode, such as an aluminum, copper, tungsten, titanium, or other conductive interconnect or electrode, such as titanium nitride or doped polysilicon. An insulating layer 105 is formed over the first conductive layer 103. Preferably, the insulating layer 105 comprises one or more sublayers of a low-k polymer dielectric described above, such as HSQ. Alternatively, the insulating layer may comprise one or more sublayers of inorganic or non-polymer dielectric materials, such as silicon oxide, silicon nitride, silicon oxynitride, fluorinated silicon oxide, PSG, BSG, BPSG and/or spin-on glass.

A narrow via 107 is formed in the insulating layer 105 which extends from the top surface 109 of the insulating layer 105 to the first conductive layer 103, as illustrated in FIG. 3A. The bottom surface of the via comprises an exposed portion of a top surface of the first conductive layer 103. Preferably, the via 107 has a circular cross section and contains only one sidewall 111 having a circular perimeter. However, the via may have a polygonal cross section and thus contain plural sidewalls. The via 107 may be formed by any patterning methods, such as by mask and etch photolithography. Preferably, the via 107 is formed by as follows. A first silicon containing imaging layer (not shown), such a polysilane imaging layer, is formed over the insulating layer 105. The imaging layer is exposed to radiation through a first mask, and the exposed portions are then removed. The via 107 is then etched in the insulating layer 105 using the remaining, unexposed portions of the imaging layer as a mask. The via is preferably dry etched using a plasma, but wet etching may also be used if desired. The remaining masking portions of the imaging layer are then removed after the via is etched. However, a conventional, carbon based photoresist layer may be used to form the via 107 instead of the silicon containing imaging layer, if desired.

Figures 3B, 3C, 3E, 3F:
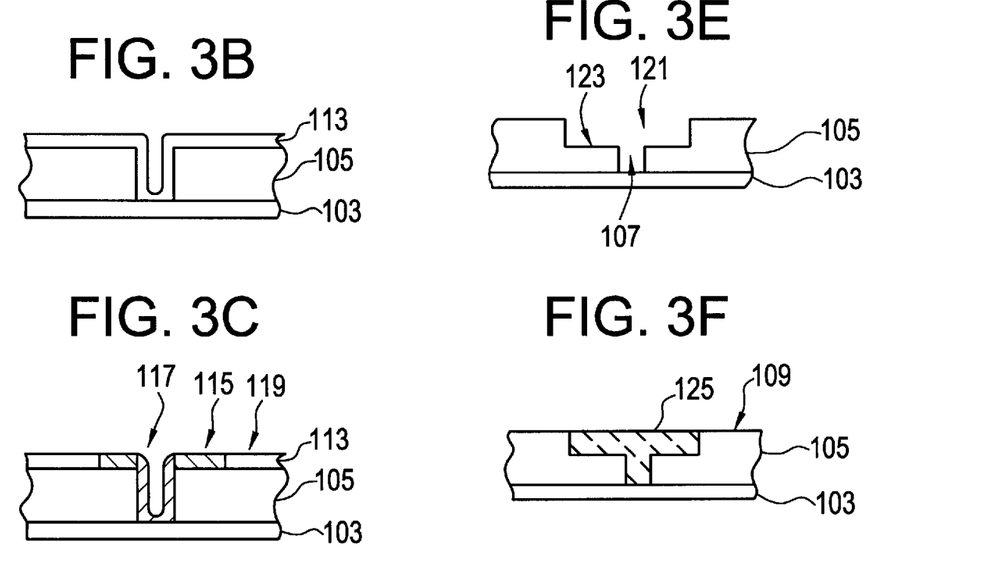

An inorganic base radiation sensitive layer 113, as described above, is formed in the via 107 and over the upper surface 109 of the insulating layer 105, as shown in FIG. 3B. For example, layer 113 may comprise a polysilane layer. Preferably, layer 113 has a thickness that is smaller than the radius of the via, such that layer 113 does not fill the entire volume of the via 107 but contacts the entire sidewall 111 and bottom surface of the via 107. The radiation sensitive layer 113 is selectively exposed to radiation, such as light or UV radiation, through a lithographic mask or reticle (not shown), as illustrated in FIG. 3C.

During the exposure, a first portion 115 of the radiation sensitive layer 113 over the upper surface 109 of the insulating layer 105 directly adjacent to via 107 sidewall 111 and a second portion 117 of the radiation sensitive layer 113 in the via 107 are exposed to radiation, as indicated by the cross hatching in FIG. 3C. A third portion 119 of the radiation sensitive layer over the upper surface 109 of the insulating layer 105 distal from the via sidewall 111 is shielded by the lithographic mask and is not exposed to radiation. The exposed positive radiation sensitive layer 113 is then patterned to remove the exposed first 115 and second 117 portions, while leaving the third portion 119 of the radiation sensitive layer 113 on the insulating layer 105 as a mask, as illustrated in FIG. 3D.

The unmasked upper surface 109 of the insulating layer 105 is then etched using the third portion 119 of the radiation sensitive layer 113 as a mask, to form a trench 121 having a width greater than that of the via 107. The remaining third portion 119 of the radiation sensitive layer 113 is then removed by conventional methods, such as ashing, to complete the dual inlaid via, as illustrated in FIG. 3E. The top of the via 107 is located in a bottom surface 123 of the trench 121. In other words, the exposed portion of the insulating layer 105 is etched to remove a top section, without etching the bottom section of the exposed portion.

A second conductive layer 125 is then formed in the trench 121 and via 107, as illustrated in FIG. 3F. The second conductive layer 125 may be a metal layer, such as copper, aluminum, tungsten, titanium or another conductive layer such a titanium nitride. The second conductive layer 125 extends through the via 107 to contact the first conductive layer 103. If desired, the second conductive layer may be planarized by chemical mechanical polishing or etch back such that its top surface is even with the upper surface 109 of the insulating layer 105, to complete the dual damascene process. However, the second conductive layer 125 does not have to have to be planarized and may protrude above surface 109 if desired. Thus, the second portion 117 of the radiation sensitive layer 113 does not form the rigid mushroom shape of FIG. 2 and is thus easy to remove from the via 107. Therefore, the problem of via poisoning is reduced or eliminated.

Figure 4A:
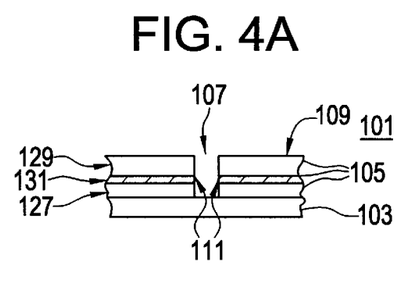
FIGS. 4A–F illustrate a side cross sectional view of a "via first" dual damascene process with an etch stop layer according to the second preferred embodiment of the present invention.
Figure 4B:
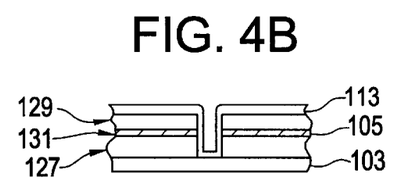
Figure 4C:
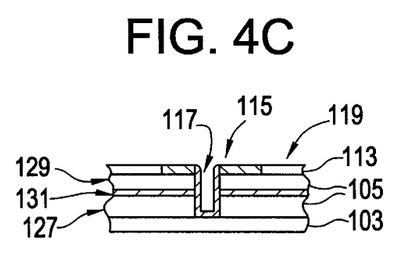
Figure 4D:
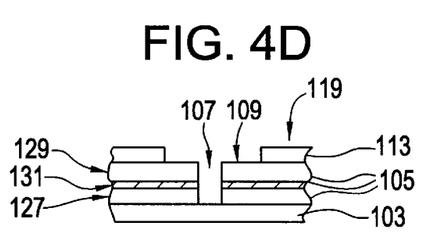

FIGS. 4A–F illustrate a second preferred embodiment of the present invention in which a dual inlaid via for a dual damascene process is formed by the "via first" patterning technique with an etch stop layer using the inorganic base radiation sensitive layer. This method is the same as the method described above with respect to FIGS. 3A–F, except that the insulating layer 105 comprises three sublayers, 127, 129 and 131, as shown in FIG. 4A.

The first and second sublayers 127 and 129 are preferably low-k dielectric layers having a dielectric constant below 3.7, preferably below 3.5. For example sublayers 127 and 129 may comprise the same or different polymer sublayers, such as HSQ sublayers. The third sublayer 131 comprises an etch stop, which has a higher etch resistance than the first and second sublayers 127 and 129 to the etching medium used to etch the first and second sublayers 127 and 129. For example, the etch stop sublayer 131 is located between the first and second sublayers 127, 129, and comprises a material that is different from the materials of the first and second sublayers 127, 129. For example, sublayer 131 may comprise silicon nitride, silicon oxynitride, tantalum pentoxide and/or silicon oxide.

Figure 4E:
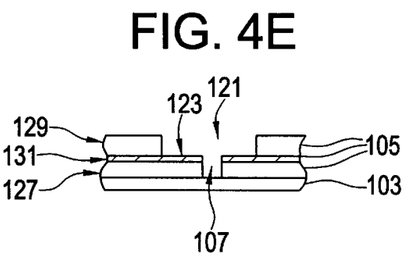
Figure 4F:
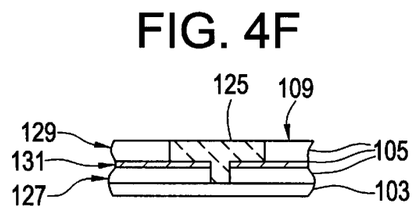

As shown in FIG. 4E, the step of etching the trench 121 automatically stops on the etch stop sublayer 131, since the etching medium used to selectively etch sublayer 129 substantially does not etch the material of sublayer 131. Thus, the via 107 is located in the first polymer sublayer 127 and the etch stop sublayer 131, and the trench is located in the second polymer sublayer 129. The method of the second preferred embodiment is advantageous compared to the method of the first preferred embodiment because the trench etch automatically stops on the etch stop sublayer. Hence, a precise control of the timing of the trench etch of the first embodiment is not required. This provides improved control of the trench depth. Other elements and steps of the second preferred embodiment illustrated in FIGS. 4A–F are the same as in the method of the first embodiment shown in FIGS. 3A-3F and described above.

FIGS. 5A–5F illustrate a third preferred embodiment of the present invention in which a dual inlaid via for a dual damascene process is formed by the "trench first" patterning method. This technique differs from the "via first" method in that the trench is formed first, and then the via is formed in a bottom surface of the trench.

Figure 5A:
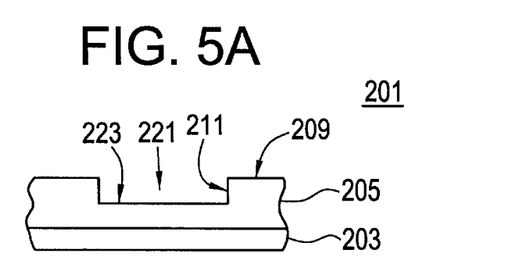
FIGS. 5A–F illustrate a side cross sectional view of a "trench first" dual damascene process according to the third preferred embodiment of the present invention.

FIG. 5A illustrates a portion of an in process metallization section 201 of a semiconductor device. The metallization section contains a first conductive layer 203. The conductive layer 203 may be a metal interconnect or electrode, such as an aluminum, copper, tungsten, titanium, or other conductive interconnect or electrode, such as titanium nitride. An insulating layer 205 is formed over the first conductive layer 203. Preferably, the insulating layer 205 comprises one or more sublayers of a low-k polymer dielectric described above, such as HSQ. Alternatively, the insulating layer may comprise one or more sublayers of inorganic or non-polymer dielectric materials, such as silicon oxide, silicon nitride, silicon oxynitride, fluorinated silicon oxide and/or spin-on glass.

A wide trench 221 is formed in the insulating layer 205. The trench 221 extends from the top surface 209 of the insulating layer 205 to a depth that is less than the thickness of the insulating layer 205. For example, the trench 221 depth may equal about 15% to 75%, preferably 25% to 65% of the thickness of the insulating layer 205. The thickness of the insulating layer is selected to provide the optimum insulating properties for a particular device. Preferably, the trench 221 has a circular cross section and contains only one sidewall 111 having a circular perimeter. However, the trench 221 may have a polygonal cross section and thus contain plural sidewalls. The trench 221 may be formed by any patterning methods, such as by mask and etch photolithography. Preferably, the trench 221 is formed by forming a first silicon containing imaging layer over the insulating layer 205, such a polysilane imaging layer. The imaging layer is exposed to radiation through a first mask, and the exposed portions are then removed. The trench 221 is then etched in the insulating layer 205 using the remaining, unexposed portions of the imaging layer as a mask. The via is preferably dry etched using a plasma, but wet etching may also be used if desired. The remaining masking portions of the imaging layer are then removed after the trench 221 is etched.

Figure 5B:
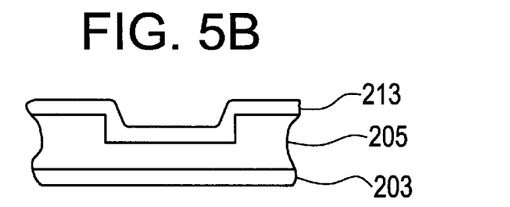

An inorganic base radiation sensitive layer 213, as described above, is formed in the trench 221 and over the upper surface 209 of the insulating layer 205, as shown in FIG. 5B. For example, layer 213 may comprise a polysilane layer. Preferably, layer 213 has a thickness that is smaller than the radius of the trench, such that layer 213 does not fill the entire volume of the trench 221, but contacts the entire sidewall and bottom surface of the trench 221. The radiation sensitive layer 213 is selectively exposed to radiation, such as light or UV radiation, through a lithographic mask or reticle (not shown), as illustrated in FIG. 5C.

Figure 5C:
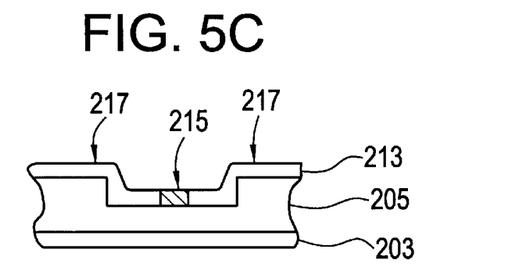
Figure 5D:
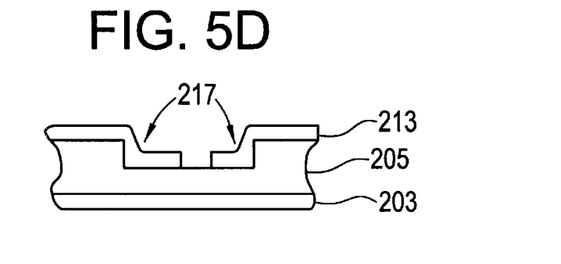

During the exposure, a first portion 215 of the radiation sensitive layer 213 over a central portion of the bottom surface 223 of the trench is exposed to radiation, as indicated by the cross hatching in FIG. 5C. A second portion 217 of the radiation sensitive layer 213 in contact with the sidewall 211 of the trench 221 and over the over the upper surface 209 of the insulating layer 205 is shielded by the lithographic mask and is not exposed to radiation. The exposed positive radiation sensitive layer 213 is then patterned to remove the exposed first portion 215 to expose the bottom surface 223 of the trench 221. The width of the first portion is about the same as the desired width of the via to be formed in the bottom surface of the trench. The unexposed second portion 217 of the radiation sensitive layer 213 is left on the insulating layer 205, the trench sidewall 211 and a peripheral portion of the bottom surface 223 of the trench 221 as a mask, as illustrated in FIG. 5D.

Figure 5E:
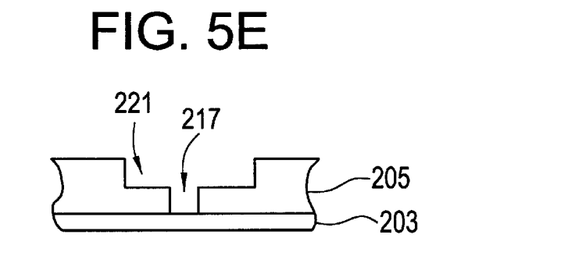

The uncovered portion of the bottom surface 223 of the trench 221 is then removed by etching using the second portion 217 of the radiation sensitive layer 213 as a mask to form a via 207 extending to the first conductive layer 203. The remaining second portion 217 of the radiation sensitive layer 213 is then removed by conventional methods, such as ashing, to complete the dual inlaid via, as illustrated in FIG. 5E. The top of the via 207 is thus located in a bottom surface 223 of the trench 221. The via 207 extends to a greater depth than the trench 221 and has a width less than that of the trench 221.

Figure 5F:
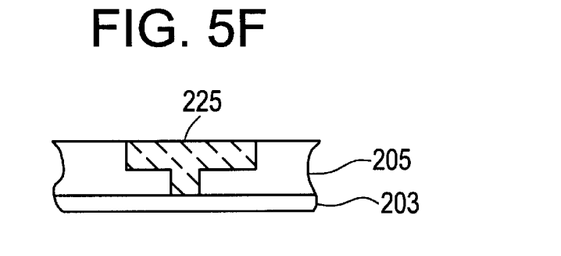

A second conductive layer 225 is then formed in the trench 221 and the via 207, as illustrated in FIG. 5F. The second conductive layer 225 may be a metal layer, such as copper, aluminum, tungsten, titanium or another conductive layer such a titanium nitride. The second conductive layer 225 extends through the via 207 to contact the first conductive layer 203. If desired, the second conductive layer may be planarized by chemical mechanical polishing or etch back such that its top surface is even with the upper surface 209 of the insulating layer 205, to complete the dual damascene process. However, the second conductive layer 225 does not have to have to be planarized and may protrude above surface 209 if desired.

Figure 6A:
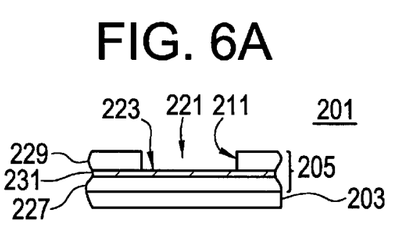
FIGS. 6A–F illustrate a side cross sectional view of a "trench first" dual damascene process with an etch stop layer according to the fourth preferred embodiment of the present invention.
Figure 6B:
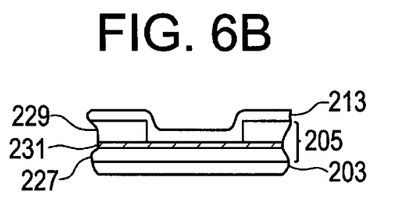
Figure 6C:
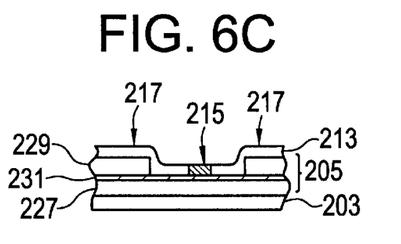
Figure 6D:
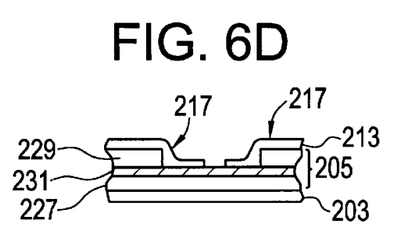
Figure 6E:
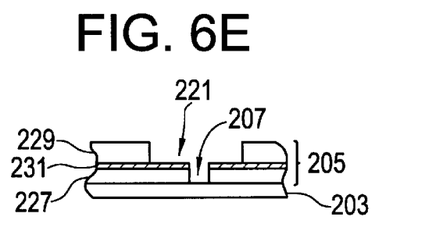
Figure 6F:
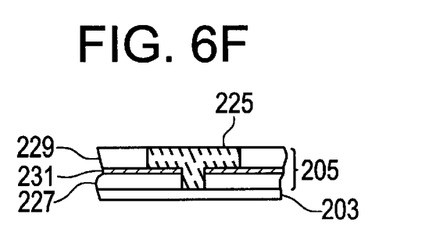

FIGS. 6A–F illustrate a fourth preferred embodiment of the present invention in which a dual inlaid via for a dual damascene process is formed by the "trench first" patterning method using the inorganic base radiation sensitive layer and an etch stop layer. This method is the same as the method described abqve with respect to FIGS. 5A–F, except that the insulating layer 205 comprises three sublayers, 227, 229 and 231, as shown in FIG. 6A.

The first and second sublayers 227 and 229 are preferably low-k dielectric layers having a dielectric constant below 3.7, preferably below 3.5. For example sublayers 227 and 229 may comprise the same or different polymer sublayers, such as HSQ sublayers. The third sublayer 231 comprises an etch stop, which has a higher etch resistance than the first and second sublayers 227 and 229 to the etching medium used to etch the first and second sublayers 227 and 229. For example, the etch stop sublayer 231 is located between the first and second sublayers 227, 229, and comprises a material that is different from the materials of the first and second sublayers 227, 229. For example, sublayer 231 may comprise silicon nitride, silicon oxynitride, tantalum pentoxide and/or silicon oxide.

As shown in FIG. 6A, the step of etching the trench 221 automatically stops on the etch stop sublayer 231, since the etching medium used to selectively etch sublayer 229 substantially does not etch the material of sublayer 231. The step of etching the via 207 in FIG. 6E can be carried out by using a two step etching process using a first etching medium (i.e., etching gas or liquid) to selectively etch sublayer 231 and then using a second etching medium to selectively etch sublayer 227. Alternatively, one step etching process may be used to etch the via by using an etching medium which etches both sublayers 231 and 227. Thus, the via 207 is located in the first polymer sublayer 227 and the etch stop 231, and the trench is located in the second polymer sublayer 229.

The method of the fourth preferred embodiment is advantageous compared to the method of the third preferred embodiment because the trench etch automatically stops on the etch stop sublayer. Hence, a precise control of the timing of the trench etch of the first embodiment is not required. This provides improved control of the trench depth. Other elements and steps of the fourth preferred embodiment illustrated in FIGS. 6A–F are the same as in the method of the third preferred embodiment shown in FIGS. 5A–F and described above.

Figure 7:
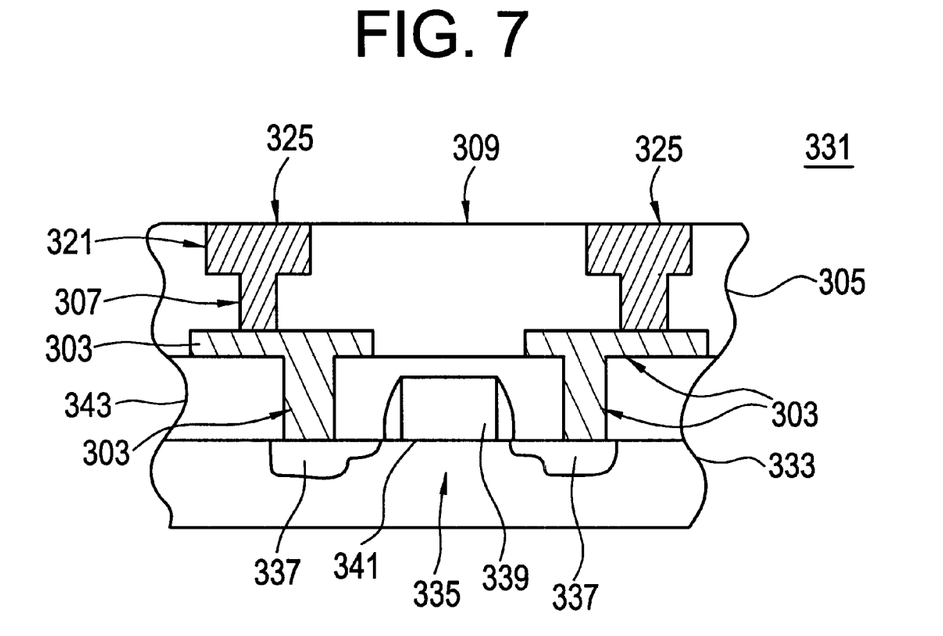
FIG. 7 illustrates a side cross sectional view of a MOSFET containing a dual inlaid via made according to the preferred embodiments of the present invention.

The in process metallization section 101, 201 may be formed as a part of any semiconductor device or other solid state device. FIG. 7 illustrates a portion of a completed semiconductor device 331 containing the dual inlaid vias made by the methods of the preferred embodiments. The semiconductor device 331 contains a substrate 333, which may be a semiconductor (such as silicon or gallium arsenide, etc.), a glass or a plastic material. One or more active elements 335 are formed on the substrate 333. The active element may comprise at least one of a MOSFET, a MESFET, a bipolar transistor, a capacitor, a resistor or any other desired device. For example, FIG. 7 illustrates a MOSFET 335.

The MOSFET 335 contains doped source and drain regions 337 in the substrate 333, a gate electrode 339 with sidewall spacers and a gate dielectric 341 between the gate electrode and the channel region in the substrate 333. At least one insulating layer overlies the active element 335. For example, the at least one insulating layer includes a first level insulating layer 343 and a first intermetal dielectric 305, as illustrated in FIG. 7. It should be understood that there may be other plural intermetal dielectric layers above layer 305 that contain vias. The first conductive layer 303 is formed between the insulating layers 305 and 343. The dual inlaid vias 307/321 are formed in the insulating layer 305 by any of the methods of the preferred embodiments. The second conductive layer 325 is formed to contact the first conductive layer 303 through the dual inlaid vias 307/321. The top surface of the second conductive layer 325 is planar and level with the top surface 309 of the intermetal dielectric 305.

While the invention has been described in detail and with reference to specific embodiments thereof, it will be apparent to one skilled in the art that various changes and modifications can be made therein without departing from the scope of the invention. Thus, the breadth and scope of the present invention should not be limited by any of the above-described exemplary embodiments, but should be defined only in accordance with the following claims and their equivalents.

We claim:

1. A method of making a dual inlaid via in a first layer, comprising:

forming a first opening in the first layer;

forming an inorganic base radiation sensitive layer in the first opening;

selectively exposing the inorganic base radiation sensitive layer to radiation;

patterning the exposed inorganic base radiation sensitive layer; and forming a second opening in communication with the first opening using the patterned inorganic base radiation sensitive layer as a mask.

2. The method of claim 1, wherein the inorganic base radiation sensitive layer comprises a silicon containing imaging layer contacting a sidewall and a bottom surface of the first opening.

3. The method of claim 2, wherein a thickness of the imaging layer is less than a radius of the first opening such that the imaging layer does not fill an entire volume of the first opening.

4. The method of claim 3, wherein the silicon containing imaging layer comprises a polysilane or a polysiloxane imaging layer.

5. The method of claim 4, wherein the imaging layer comprises a polysilane polymer imaging layer.

6. The method of claim 5, wherein the step of forming the first opening comprises:

forming a second imaging layer over the first layer;

forming a third opening in the second imaging layer;

etching the first opening in the first layer through the third opening in the second imaging layer; and removing the second imaging layer.

7. The method of claim 3, wherein the first opening comprises a via having a first width and the second opening comprises a trench having a second width greater than the first width, the trench being located in the first layer directly above the via.

8. The method of claim 7, wherein:

the step of forming the first opening comprises forming the via to a first depth in the first layer;

the step of patterning the exposed inorganic base radiation sensitive layer comprises removing a first portion of the inorganic base radiation sensitive layer from an upper surface of the first layer directly adjacent to via sidewall and a second portion of the inorganic base radiation sensitive layer in contact with the via sidewall and the bottom surface of the via, while leaving a third portion of the inorganic base radiation sensitive layer over the upper surface of the first layer distal from the via sidewall; and the step of forming the second opening comprises removing an upper portion of the first layer directly adjacent to the via sidewall using the third portion as a mask to form the trench.

9. The method of claim 8, wherein the trench has a second depth less than the first depth, such that a bottom surface of the trench is adjacent to top portions of the via sidewall.

10. The method of claim 7, wherein:

the first layer comprises an insulating layer containing a first polymer sublayer, an etch stop sublayer above the first polymer sublayer and a second polymer sublayer above the etch stop sublayer;

the first and second polymer sublayers have a dielectric constant of 3.7 or less;

wherein forming the first opening comprises forming the via in the first polymer sublayer and the etch stop layer; and forming the second opening comprises forming the trench in the second polymer sublayer.

11. The method of claim 3, wherein the first opening comprises a trench having a first width and the second opening comprises a via having a second width less than the first width, the trench being located in the first layer directly above the via.

12. The method of claim 11, wherein:

the step of forming the first opening comprises forming the trench to a first depth in the first layer;

the step of patterning the exposed inorganic base radiation sensitive layer comprises removing a first portion of the inorganic base radiation sensitive layer from a first portion of a bottom surface of the trench, while leaving a second portion of the inorganic base radiation sensitive layer on a sidewall of the trench; and the step of forming the second opening comprises removing a portion of the first layer directly below the first portion of the bottom surface of the trench to form the via.

13. The method of claim 12, wherein the via has a second depth greater than the first depth.

14. The method of claim 1, wherein the inorganic base radiation sensitive layer comprises a chalcogenide glass photoresist.

15. The method of claim 1, wherein the first layer comprises an insulating layer having a dielectric constant of 3.7 or less.

16. The method of claim 15, wherein the insulating layer comprises at least one polymer having a formula: $[(HSiO_{1.5})_x\ O_y]_n$, $(HSiO_{1.5})_n$, $[(HSiO_{1.5})_x\ O_y\ (RSiO_{1.5})_z]_n$, $[(HSiO_{1.5})_x\ (RSiO_{1.5})_y]_n$, wherein x=6 to 20, y=1 to 3, z=6 to 20, n=1 to 4,000, and each R is independently H, $C_1$ to $C_8$ alkyl or $C_6$ to $C_{12}$ aryl.

17. The method of claim 16, wherein the insulating layer comprises hydrogensilsesquioxane.

18. The method of claim 15, wherein the insulating layer comprises organic spin-on glass, polysilsequioxane, siloxane parylene, PTFE, polyimide, fluorinated polyimide, benzocyclobutene, fluorinated benzocyclobutene, polyarylene ether or fluorinated polyarylene ether.

19. The method of claim 1, wherein the step of patterning the exposed inorganic base radiation sensitive layer comprises removing a portion of the radiation sensitive layer that was exposed to radiation.

20. A method of making a semiconductor device containing a dual inlaid via, comprising:

a) forming a via in a polymer containing insulating layer;

b) forming a first silicon backbone containing polymer imaging layer in the via in contact with the via sidewall and a bottom surface of the via and over an upper surface of the insulating layer;

c) selectively exposing the imaging layer to radiation;

d) patterning the exposed first imaging layer to remove a first portion of the first imaging layer from the upper surface of the insulating layer directly adjacent to via sidewall and a second portion of the first imaging layer in contact with the via sidewall and the bottom surface of the via, while leaving a third portion of the first imaging layer over the upper surface of the insulating layer distal from the via sidewall; and e) etching an exposed upper portion of the insulating layer using the third portion of the imaging layer as a mask to form a trench having a width greater than that of the via, such that a top of the via is located in a bottom surface of the trench.

21. The method of claim 20, wherein:

the insulating layer comprises hydrogensilsesquioxane; and the first imaging layer comprises a positive polysilane imaging layer having a thickness smaller than a radius of the via, such that the imaging layer does not fill the entire volume of the via.

22. The method of claim 21, wherein the imaging layer thickness is 200 to 2,000 angstroms.

23. The method of claim 20, wherein the step of selectively exposing the imaging layer comprising exposing the first and second portions of the imaging layer to radiation through a mask without exposing the third portion of the imaging layer.

24. The method of claim 23, further comprising prior to steps a)–e):

forming an active element over a substrate;

forming a first conductive layer over the active element;

forming the polymer containing insulating layer over the first conductive layer;

forming a second silicon backbone containing polymer imaging layer over the polymer containing insulating layer;

patterning the second imaging layer;

forming the via through the insulating layer to the first conductive layer; and after steps a)–e):

forming a second conductive layer in the trench such that the second conductive layer contacts the first conductive layer through the via; and planarizing the second conductive layer such that a top surface of the second conductive layer is substantially level with the upper surface of the insulating layer.

25. The method of claim 24, wherein the polymer containing insulating layer comprises two polymer sublayers separated by an inorganic etch stop sublayer.

26. A method of making a semiconductor device containing a dual damascene contact, comprising:

forming an active element over a substrate;

forming a first conductive layer over the active element;

forming an insulating layer over the first conductive layer;

forming a first polysilane imaging layer over the insulating layer;

selectively exposing the first imaging layer to radiation;

patterning the first imaging layer;

etching the insulating layer using the patterned first imaging layer as a mask to form a via having a first radius extending through the insulating layer to the first conductive layer;

removing the first imaging layer;

forming a second polysilane imaging layer having a thickness smaller than the first radius in the via in contact with via sidewall and a bottom surface of the via and over an upper surface of the insulating layer, such that the second polysilane imaging layer does not fill an entire volume of the via;

selectively exposing a first and a second portions of the second imaging layer to radiation through a mask;

patterning the exposed second imaging layer to remove the first portion of the second imaging layer from the upper surface of the insulating layer directly adjacent to the via sidewall and a second portion of the second imaging layer in contact with the sidewall and the bottom surface of the via, while leaving a third portion of the second imaging layer over the upper surface of the insulating layer distal from the via sidewall;

etching an exposed upper portion of the insulating layer using the third portion of the second imaging layer as a mask to form a trench having a width greater than that of the via, such that a top of the via is located in a bottom surface of the trench;

forming a second conductive layer in the trench such that the second conductive layer contacts the first conductive layer through the via; and planarizing the second conductive layer such that a top surface of the second conductive layer is substantially level with the upper surface of the insulating layer.

27. The method of claim 26, wherein the insulating layer contains an inorganic etch stop sublayer between two hydrogensilsesquioxane sublayer portions.

28. The method of claim 26, wherein the second polysilane imaging layer has a thickness of 200 to 2,000 angstroms, and the first radius comprises 900 to 2250 angstroms.

29. The method of claim 26, wherein the active element comprises a MOSFET.

* * * * *